United States Patent
Sekimoto

(10) Patent No.: US 11,612,017 B2
(45) Date of Patent: Mar. 21, 2023

(54) SUBSTRATE PROCESSING APPARATUS AND SUBSTRATE PROCESSING METHOD

(71) Applicant: TOKYO ELECTRON LIMITED, Tokyo (JP)

(72) Inventor: Eiichi Sekimoto, Koshi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 625 days.

(21) Appl. No.: 16/674,616

(22) Filed: Nov. 5, 2019

(65) Prior Publication Data

US 2020/0146111 A1    May 7, 2020

(30) Foreign Application Priority Data

Nov. 7, 2018 (JP) .............................. JP2018-210067

(51) Int. Cl.
*H05B 1/02* (2006.01)
*H01L 21/67* (2006.01)

(52) U.S. Cl.
CPC ....... *H05B 1/0233* (2013.01); *H01L 21/6715* (2013.01); *H01L 21/67248* (2013.01); *H01L 21/67253* (2013.01)

(58) Field of Classification Search
CPC .............. H05B 1/0233; H01L 21/6715; H01L 21/67248; H01L 21/67253; H01L 21/67115
See application file for complete search history.

(56) References Cited

U.S. PATENT DOCUMENTS

| | | | |
|---|---|---|---|
| 2008/0169282 A1* | 7/2008 | Sorabji | H01L 21/67248 219/448.11 |
| 2011/0174790 A1* | 7/2011 | Suzuki | H01L 21/67115 219/121.84 |

FOREIGN PATENT DOCUMENTS

| | | |
|---|---|---|
| JP | 2002280318 A | 2/2002 |
| JP | 2002280318 A | 9/2002 |
| JP | 201034491 A | 2/2010 |
| JP | 2012243869 A | 12/2012 |

\* cited by examiner

*Primary Examiner* — Syed I Gheyas
(74) *Attorney, Agent, or Firm* — Nath, Goldberg & Meyer; Jerald L. Meyer; Tanya E. Harkins

(57) ABSTRACT

There is provided a substrate processing apparatus, including: a substrate holding/rotating part configured to hold a substrate on a mounting table and rotate the substrate; a laser irradiation head configured to irradiate a laser beam toward a lower surface of the mounting table; and a controller configured to control at least the rotation of the substrate holding/rotating part and the irradiation of the laser beam. The laser irradiation head is fixed below the mounting table so as to be spaced apart from the mounting table. The controller controls the laser irradiation head to irradiate the laser beam when the mounting table is rotated by the substrate holding/rotating part.

9 Claims, 16 Drawing Sheets

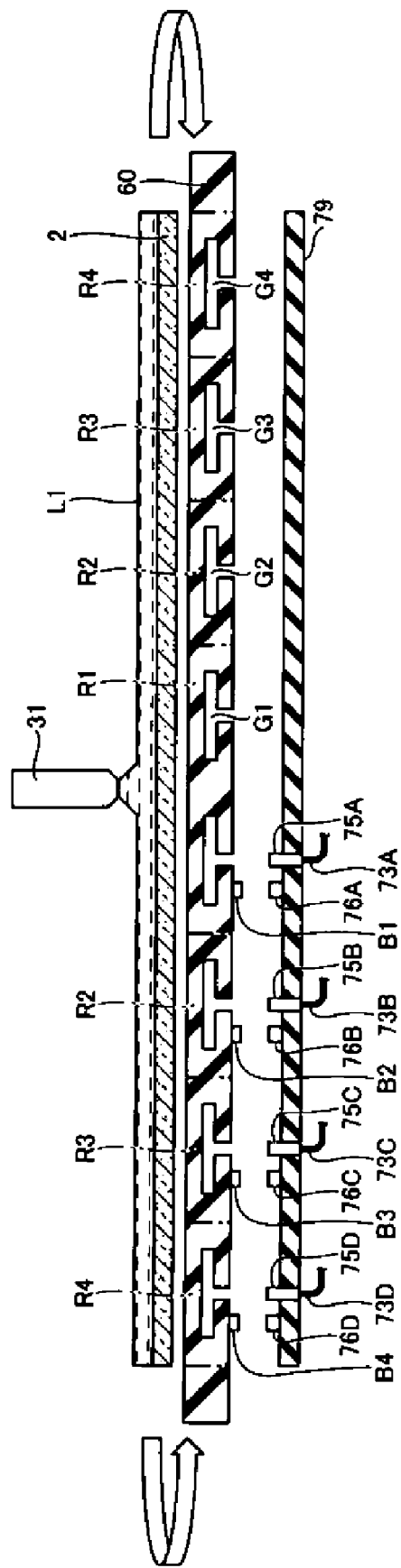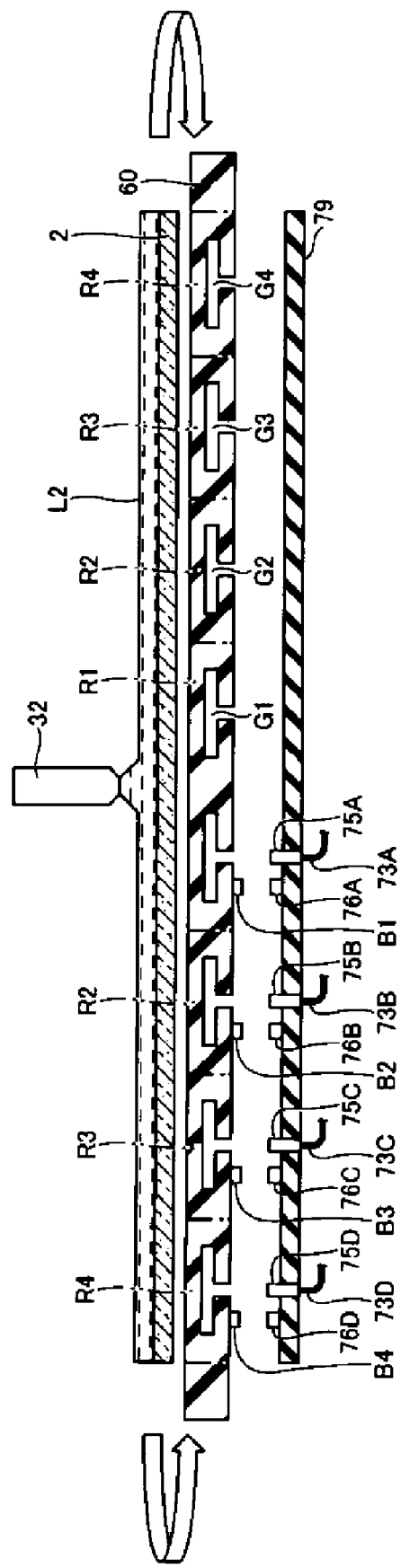

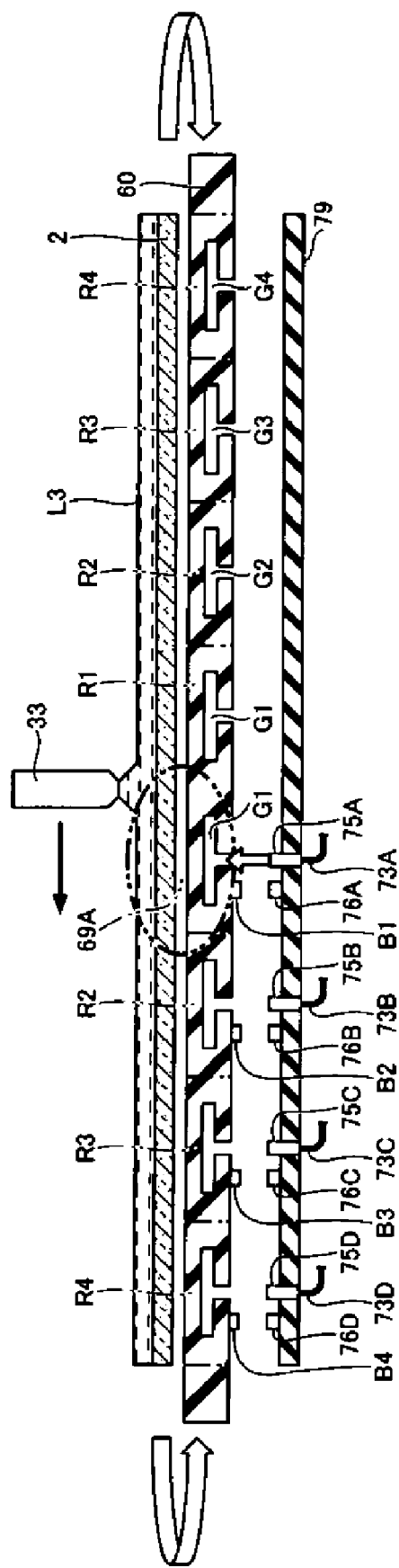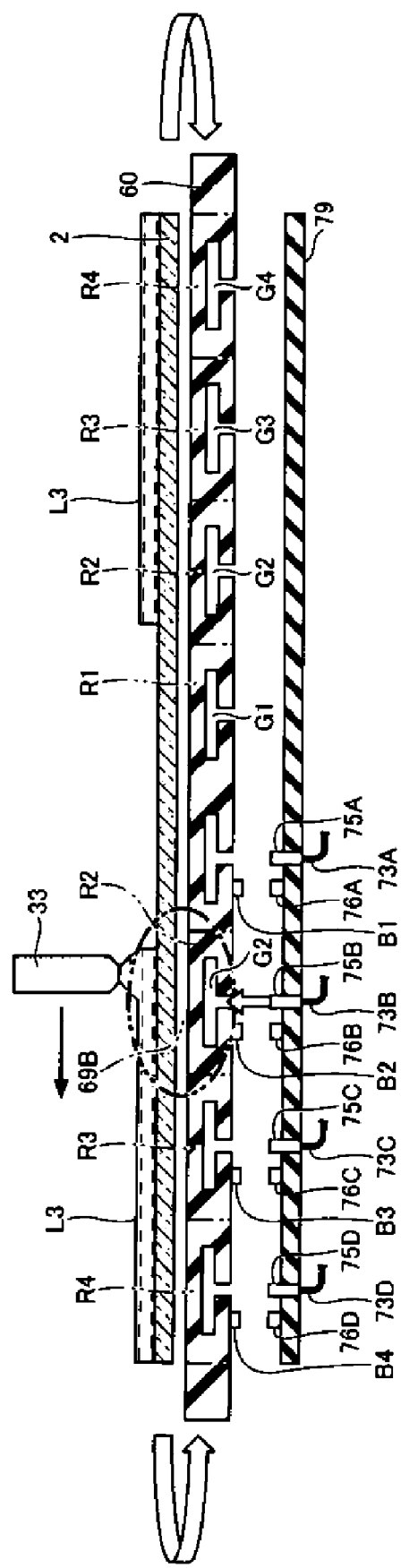

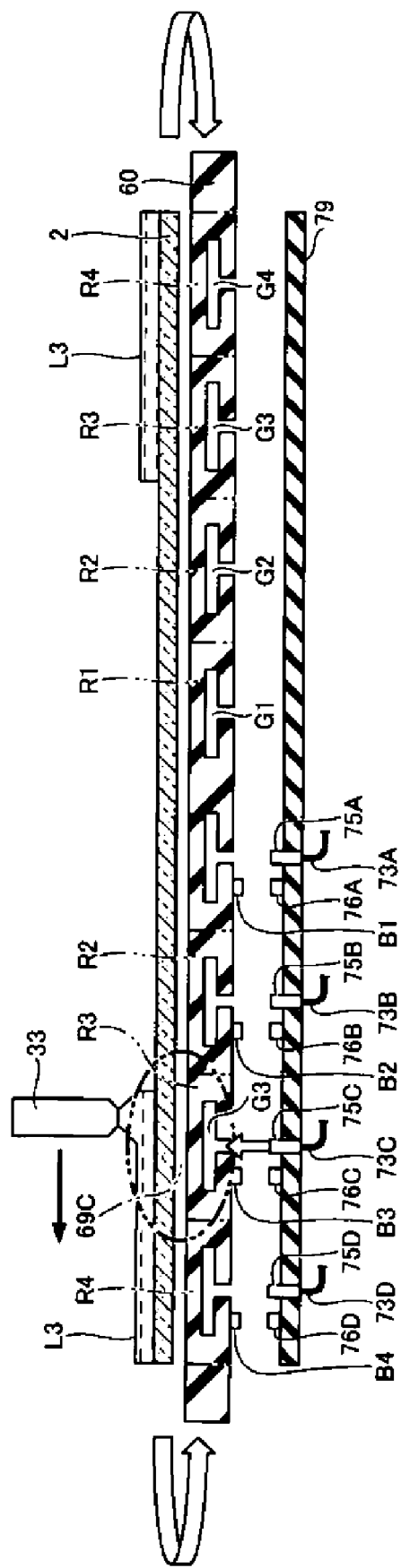

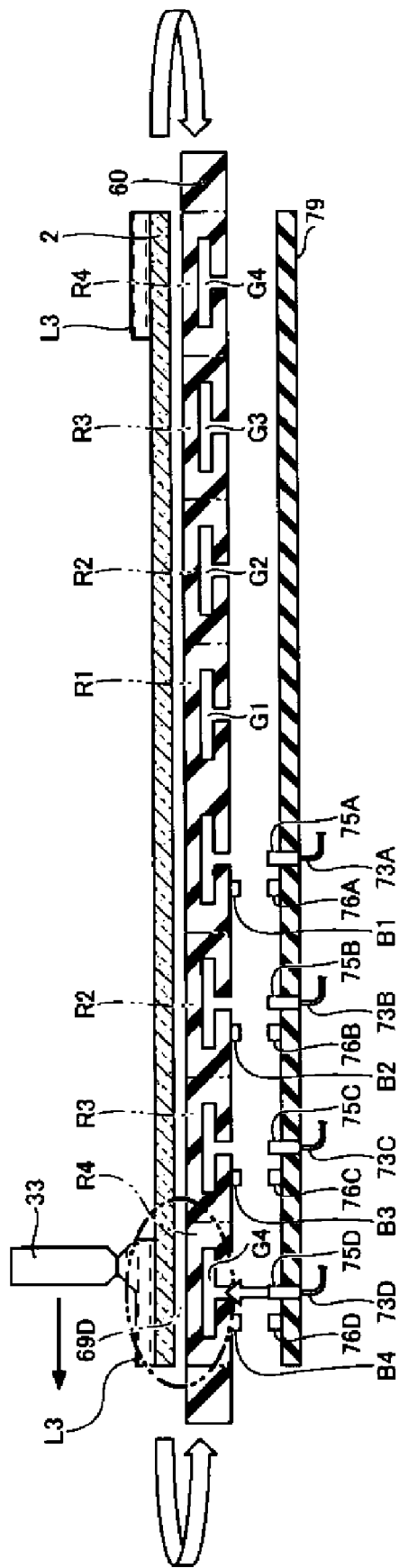
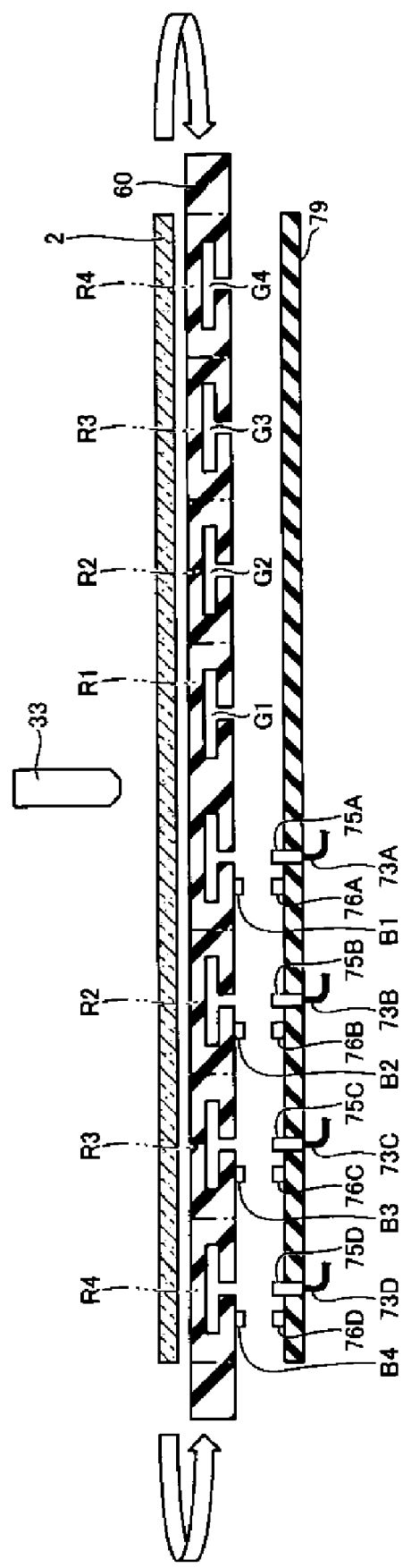
FIG. 11A
FIG. 11B

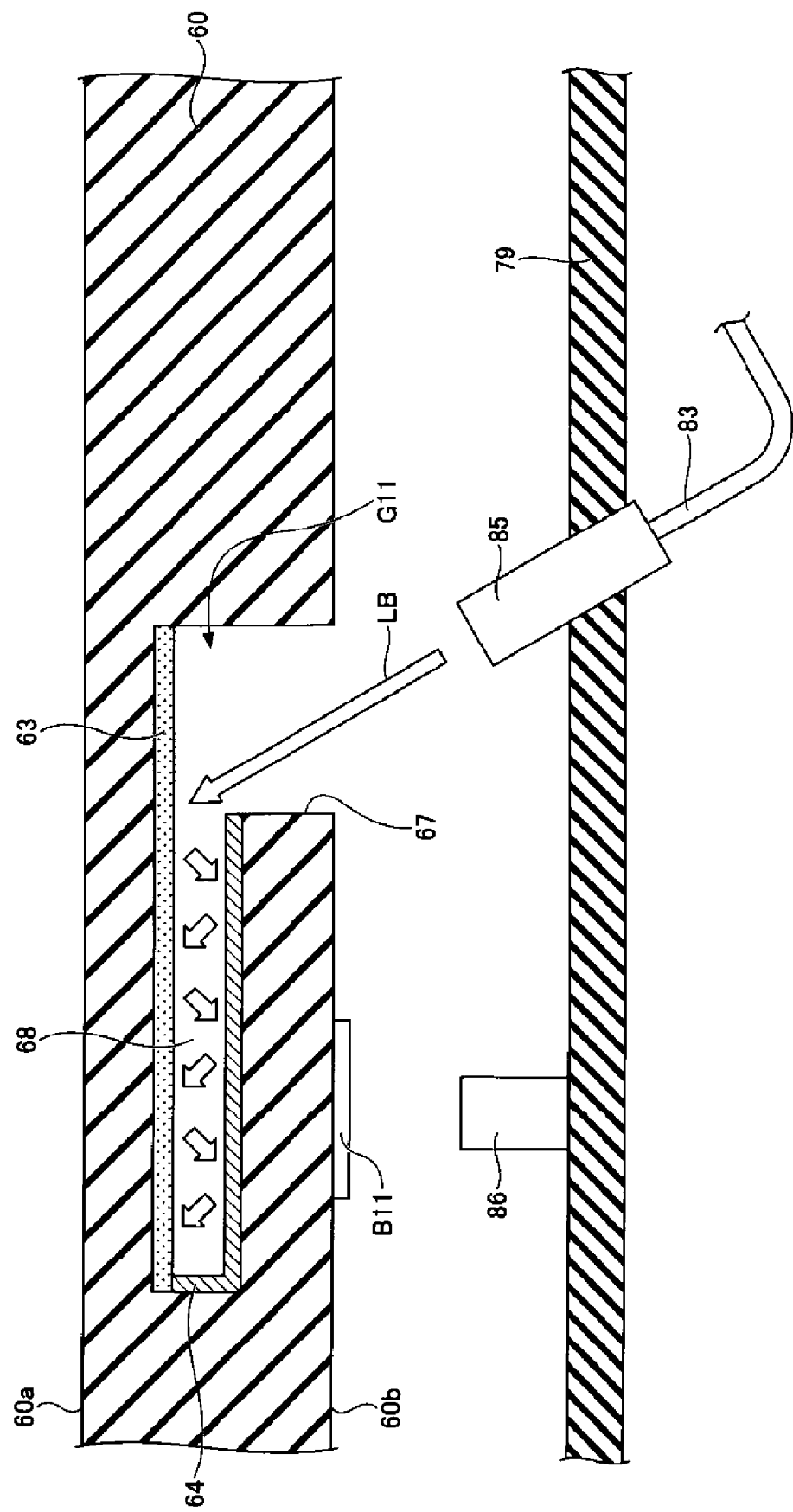

SUBSTRATE PROCESSING APPARATUS AND SUBSTRATE PROCESSING METHOD

CROSS-REFERENCE TO RELATED APPLICATION

This application is based upon and claims the benefit of priority from Japanese Patent Application No. 2018-210067, filed on Nov. 7, 2018, the entire contents of which are incorporated herein by reference.

TECHNICAL FIELD

The present disclosure relates to a substrate processing apparatus and a substrate processing method.

BACKGROUND

When performing a chemical liquid processing on a substrate of a semiconductor device or the like, it is desired to heat the substrate in order to improve the reaction efficiency. To do this, there has been proposed a configuration in which a resistance heater is provided in a disc portion of a substrate holder that holds the substrate in a horizontal posture.

PRIOR ART DOCUMENT

Patent Documents

Patent Document 1: Japanese Laid-Open Patent Publication No. 2012-243869

SUMMARY

According to one embodiment of the present disclosure, there is provided a substrate processing apparatus, including: a substrate holding/rotating part configured to hold a substrate on a mounting table and rotate the substrate; a laser irradiation head configured to irradiate a laser beam toward a lower surface of the mounting table; and a controller configured to control at least the rotation of the substrate holding/rotating part and the irradiation of the laser beam. The laser irradiation head is fixed below the mounting table so as to be spaced apart from the mounting table. The controller controls the laser irradiation head to irradiate the laser beam when the mounting table is rotated by the substrate holding/rotating part.

BRIEF DESCRIPTION OF DRAWINGS

The accompanying drawings, which are incorporated in and constitute a portion of the specification, illustrate embodiments of the present disclosure, and together with the general description given above and the detailed description of the embodiments given below, serve to explain the principles of the present disclosure.

FIGS. 9A, 9B and 9C are views showing a change in the state of the substrate processing apparatus according to the first embodiment.

FIGS. 10A, 10B and 10C are views showing a change in the state of the substrate processing apparatus according to the first embodiment.

FIGS. 11A, 11B and 11C are views showing a change in the state of the substrate processing apparatus according to the first embodiment.

FIG. 12 is a sectional view showing a groove according to a modification and the periphery of the groove.

DETAILED DESCRIPTION

Figure 1:
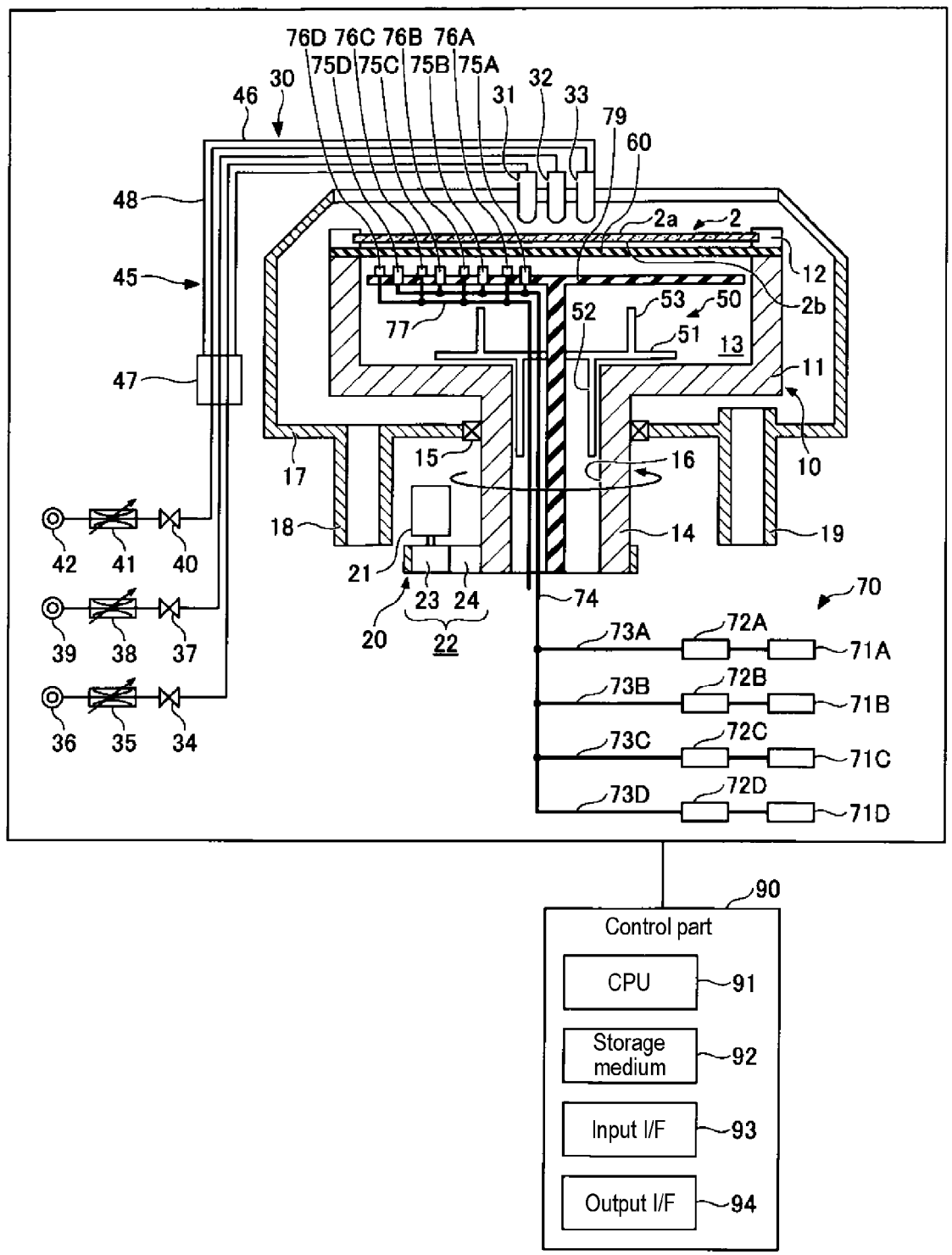
FIG. 1 is a view showing a substrate processing apparatus according to a first embodiment.

Hereinafter, embodiments of the present disclosure will be described with reference to the drawings. In the drawings, the same or corresponding components are denoted by the same or corresponding reference numerals, and the description thereof is omitted in some cases. In the subject specification, the term "downward" refers to downward in the vertical direction, and the term "upward" refers to upward in the vertical direction.

First Embodiment

Figure 2:
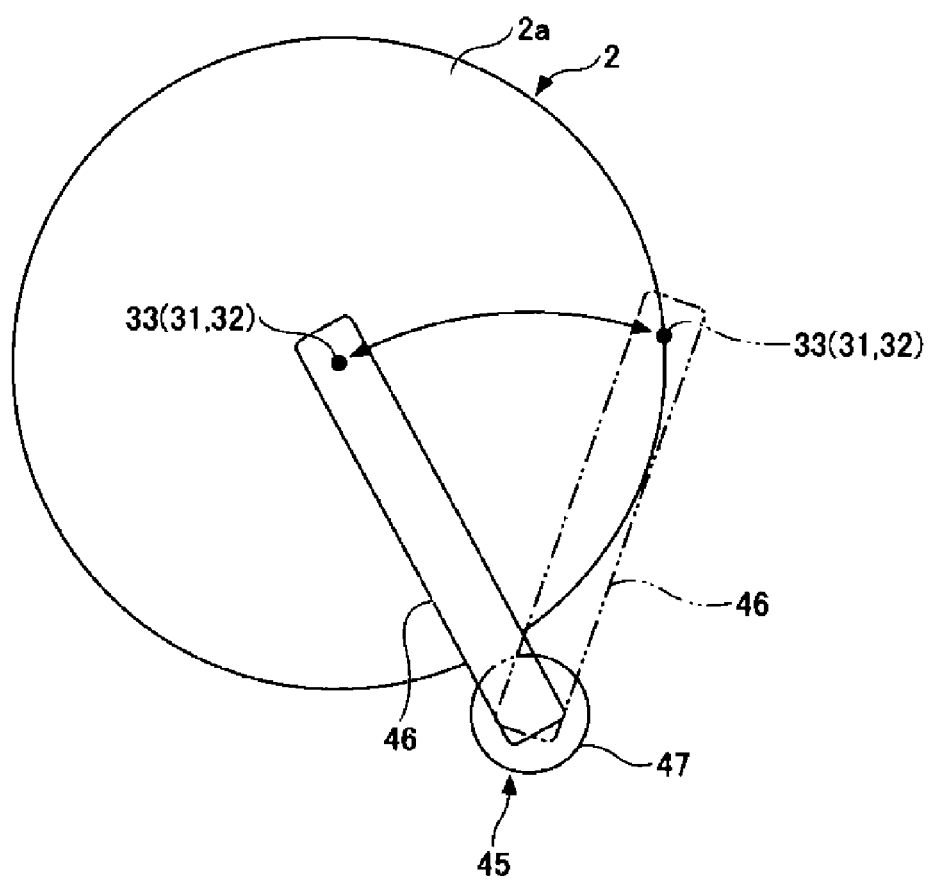
FIG. 2 is a view showing a liquid discharge nozzle moving mechanism included in the substrate processing apparatus according to the first embodiment.

First, a first embodiment will be described. FIG. 1 is a view showing a substrate processing apparatus according to the first embodiment. FIG. 2 is a view showing a liquid discharge nozzle moving mechanism included in the substrate processing apparatus according to the first embodiment. As shown in FIG. 1, the substrate processing apparatus 1 according to the first embodiment includes, for example, a substrate holding part 10, a rotary drive part 20, a liquid supply unit 30, a substrate elevating member 50, a heating unit 70 and a control part 90. The substrate holding part 10 and the rotary drive part 20 are included in a substrate holding/rotating part.

The substrate holding part 10 holds the substrate 2 in a horizontal posture so that an upper surface 2a of the substrate 2 having an uneven pattern formed thereon faces upward. The substrate 2 may be a semiconductor substrate such as a silicon wafer or the like. The uneven pattern may be formed by a photolithography method. In addition to the photolithography method, an etching method may be used. The uneven pattern may be formed by exposure and development of a photoresist formed on the substrate 2. The uneven pattern may be formed by etching a film (for example, a silicon nitride film) formed on the substrate 2.

The substrate holding part 10 includes a disk-shaped hot plate 60, a guide portion 12 disposed on an outer periphery of the hot plate 60 and a hot plate support member 11 that supports the hot plate 60. The guide portion 12 has an annular shape in a plan view and holds an outer peripheral edge of the substrate 2 in a state in which the substrate 2 floats from the hot plate 60. A gap space 13 is formed between the substrate 2 and the bottom of the hot plate support member 11. The hot plate 60 is an example of a mounting table.

In addition, the substrate holding part 10 includes a rotary shaft portion 14 extending downward from the center of the hot plate support member 11. The rotary shaft portion 14 is rotatably supported by bearings 15. A through-hole 16 is formed in the center of the hot plate support member 11. The rotary shaft portion 14 is formed in a tubular shape. The internal space of the rotary shaft portion 14 communicates with the gap space 13 via the through-hole 16.

The rotary drive part 20 rotates the substrate holding part 10. The rotary drive part 20 rotates the substrate holding part 10 about the rotary shaft portion 14 of the substrate holding part 10. As the substrate holding part 10 rotates, the substrate 2 held by the substrate holding part 10 is rotated.

The rotary drive part 20 includes a rotary motor 21 and a transmission mechanism 22 that transmits the rotary motion of the rotary motor 21 to the rotary shaft portion 14. The transmission mechanism 22 includes, for example, a pulley 23 and a timing belt 24. The pulley 23 is attached to an output shaft of the rotary motor 21 to rotate together with the output shaft. The timing belt 24 extends to engage the pulley 23 and the rotary shaft portion 14. The transmission mechanism 22 transmits the rotary motion of the rotary motor 21 to the rotary shaft portion 14. The transmission mechanism 22 may include a plurality of gears instead of the pulley 23 and the timing belt 24.

The liquid supply unit 30 supplies a processing liquid from above toward the substrate 2 held by the substrate holding part 10. The liquid supply unit 30 may supply a plurality of types of processing liquids and may supply processing liquids depending on the processing stage of the substrate 2. Examples of the processing liquid supplied by the liquid supply unit 30 may include a cleaning liquid L1 (see FIG. 9A), a rinsing liquid L2 (see FIG. 9B) and a drying liquid L3 (see FIG. 9C). The cleaning liquid is also called a chemical liquid.

The liquid supply unit 30 has a liquid discharge nozzle that discharges the processing liquid. The liquid supply unit 30 includes, for example, a cleaning liquid discharge nozzle 31, a rinsing liquid discharge nozzle 32 and a drying liquid discharge nozzle 33 as liquid discharge nozzles. The cleaning liquid discharge nozzle 31 discharges the cleaning liquid L1, the rinsing liquid discharge nozzle 32 discharges the rinsing liquid L2, and the drying liquid discharge nozzle 33 discharges the drying liquid L3. One liquid discharge nozzle may discharge plural types of processing liquids. The liquid discharge nozzle may discharge a processing liquid mixed with a gas.

The cleaning liquid discharge nozzle 31 is connected to a source 36 via an on-off valve 34 and a flow rate adjustment valve 35. When the on-off valve 34 opens a flow path of the cleaning liquid L1, the cleaning liquid L1 is discharged from the cleaning liquid discharge nozzle 31. On the other hand, when the on-off valve 34 closes the flow path of the cleaning liquid L1, the discharge of the cleaning liquid L1 from the cleaning liquid discharge nozzle 31 is stopped. The flow rate adjustment valve 35 adjusts a flow rate of the cleaning liquid L1 discharged from the cleaning liquid discharge nozzle 31. The source 36 supplies the cleaning liquid L1 to the cleaning liquid discharge nozzle 31.

The cleaning liquid L1 is not particularly limited. For example, DHF (dilute hydrofluoric acid) may be used as the cleaning liquid L1. A temperature of the cleaning liquid L1 may be room temperature, or may be higher than the room temperature and lower than a boiling point of the cleaning liquid L1.

The cleaning liquid L1 may be any general liquid used for cleaning a semiconductor substrate, and is not limited to DHF. For example, the cleaning liquid L1 may be SC-1 (an aqueous solution containing ammonium hydroxide and hydrogen peroxide) or SC-2 (an aqueous solution containing hydrogen chloride and hydrogen peroxide). A plurality of types of cleaning liquid L1 may be used.

The rinsing liquid discharge nozzle 32 is connected to a source 39 via an on-off valve 37 and a flow rate adjustment valve 38. When the on-off valve 37 opens a flow path of the rinsing liquid L2, the rinsing liquid L2 is discharged from the rinsing liquid discharge nozzle 32. On the other hand, when the on-off valve 37 closes the flow path of the rinsing liquid L2, the discharge of the rinsing liquid L2 from the rinsing liquid discharge nozzle 32 is stopped. The flow rate adjustment valve 38 adjusts a flow rate of the rinsing liquid L2 discharged from the rinsing liquid discharge nozzle 32. The source 39 supplies the rinsing liquid L2 to the rinsing liquid discharge nozzle 32.

The rinsing liquid L2 is not particularly limited. For example, DIW (deionized water) may be used as the rinsing liquid L2. A temperature of the rinsing liquid L2 may be room temperature, or may be higher than the room temperature and lower than a boiling point of the rinsing liquid L2.

The drying liquid discharge nozzle 33 is connected to a source 42 via an on-off valve 40 and a flow rate adjustment valve 41. When the on-off valve 40 opens a flow path of the drying liquid L3, the drying liquid L3 is discharged from the drying liquid discharge nozzle 33. On the other hand, when the on-off valve 40 closes the flow path of the drying liquid L3, the discharge of the drying liquid L3 from the drying liquid discharge nozzle 33 is stopped. The flow rate adjustment valve 41 adjusts a flow rate of the drying liquid L3 discharged from the drying liquid discharge nozzle 33. The source 42 supplies the drying liquid L3 to the drying liquid discharge nozzle 33.

The drying liquid L3 is not particularly limited. For example, IPA (isopropyl alcohol) may be used as the drying liquid L3. A temperature of the drying liquid L3 may be room temperature, or may be higher than the room temperature and lower than a boiling point of the drying liquid L3.

The drying liquid L3 is not limited to IPA. For example, the drying liquid L3 may be HFE (hydrofluoroether), methanol, ethanol, acetone, or trans-1,2-dichloroethylene.

For example, the liquid supply unit 30 supplies the processing liquid such as the cleaning liquid L1, the rinsing liquid L2, the drying liquid L3 and the like toward the central portion of the substrate 2 rotating together with the substrate holding part 10. The processing liquid supplied to the central portion of the rotating substrate 2 is spread over the entire upper surface 2a of the substrate 2 by virtue of a centrifugal force and is dropped from the outer peripheral edge of the substrate 2. Liquid droplets of the processing liquid thus dropped are collected in a cup 17.

The cup 17 holds a bearing 15 that rotatably supports the substrate holding part 10 and does not rotate together with the substrate holding part 10. A drain pipe 18 and an exhaust pipe 19 are provided in the bottom of the cup 17. The drain pipe 18 discharges the liquid existing in the cup 17, and the exhaust pipe 19 discharges the gas existing in the cup 17.

The liquid supply unit 30 includes a liquid discharge nozzle moving mechanism 45. The liquid discharge nozzle moving mechanism 45 moves the cleaning liquid discharge nozzle 31, the rinsing liquid discharge nozzle 32 and the drying liquid discharge nozzle 33 in the horizontal direction. As shown in FIG. 2, the liquid discharge nozzle moving mechanism 45 moves the cleaning liquid discharge nozzle 31, the rinsing liquid discharge nozzle 32 and the drying liquid discharge nozzle 33 between a position directly above the central portion of the substrate 2 and a position directly above the outer peripheral portion of the substrate 2. The cleaning liquid discharge nozzle 31, the rinsing liquid discharge nozzle 32 and the drying liquid discharge nozzle 33 may be further moved to a standby position defined more radially outward of the substrate 2 than the outer peripheral portion of the substrate 2.

For example, the liquid discharge nozzle moving mechanism 45 includes a swivel arm 46 and a swivel mechanism 47 for swiveling the swivel arm 46. The swivel arm 46 is horizontally disposed to hold, at a distal end portion thereof, the cleaning liquid discharge nozzle 31, the rinsing liquid discharge nozzle 32 and the drying liquid discharge nozzle 33 so that discharge ports 31a, 32a and 33a (see FIGS. 9A to 9C) formed in the respective nozzles 31, 32 and 33 face downward. As shown in FIG. 2, the swivel mechanism 47 swivels the swivel arm 46 about a swivel shaft 48 extending downward from a base end portion of the swivel arm 46. The liquid discharge nozzle moving mechanism 45 moves the cleaning liquid discharge nozzle 31, the rinsing liquid discharge nozzle 32 and the drying liquid discharge nozzle 33 in the horizontal direction by swiveling the swivel arm 46.

The liquid discharge nozzle moving mechanism 45 may include a guide rail and a linear motion mechanism instead of the swivel arm 46 and the swivel mechanism 47. The guide rail is disposed horizontally. The linear motion mechanism moves the cleaning liquid discharge nozzle 31, the rinsing liquid discharge nozzle 32 and the drying liquid discharge nozzle 33 along the guide rail. Furthermore, in the present embodiment, the liquid discharge nozzle moving mechanism 45 simultaneously moves the cleaning liquid discharge nozzle 31, the rinsing liquid discharge nozzle 32 and the drying liquid discharge nozzle 33 in the same direction at the same speed. In some embodiments, the liquid discharge nozzle moving mechanism 45 may move the cleaning liquid discharge nozzle 31, the rinsing liquid discharge nozzle 32 and the drying liquid discharge nozzle 33 independently of one another.

The heating unit 70 includes light sources 71A, 71B, 71C and 71D for generating a laser beam LB that heats the hot plate 60. The light sources 71A to 71D are disposed outside the rotary shaft portion 14. The light sources 71A to 71D may generate the laser beam LB in a pulse-like manner or in a continuous manner.

The heating unit 70 includes homogenizers 72A, 72B, 72C and 72D that convert the power distribution of the laser beam LB emitted from the light sources 71A, 71B, 71C and 71D, respectively. For example, the homogenizers 72A to 72D convert the power distribution of the laser beam LB from a Gaussian distribution (see FIG. 3A) to a top hat distribution (see FIG. 3B). The homogenizers 72A to 72D may form an intermediate distribution between the Gaussian distribution and the top hat distribution.

Figure 3A:
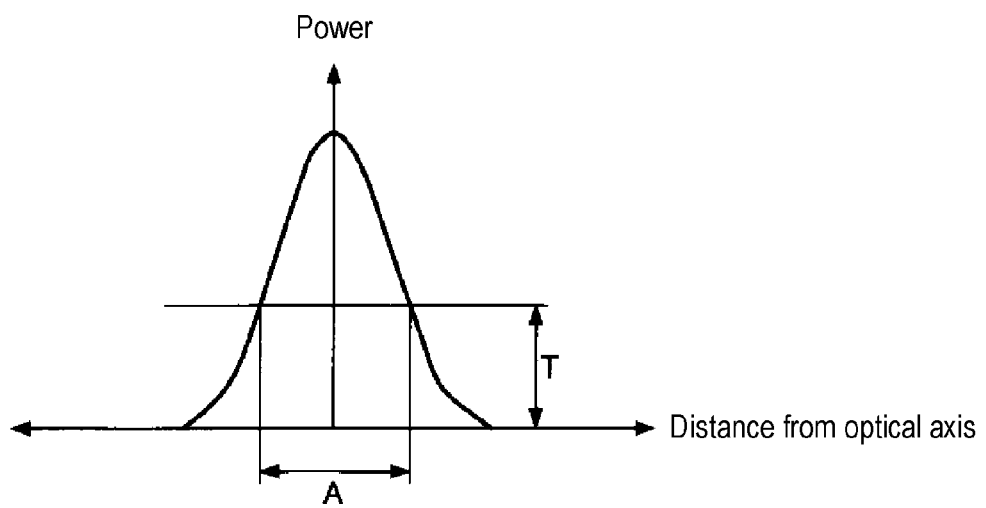
FIGS. 3A and 3B are views showing a power distribution of a laser beam.
Figure 3B:
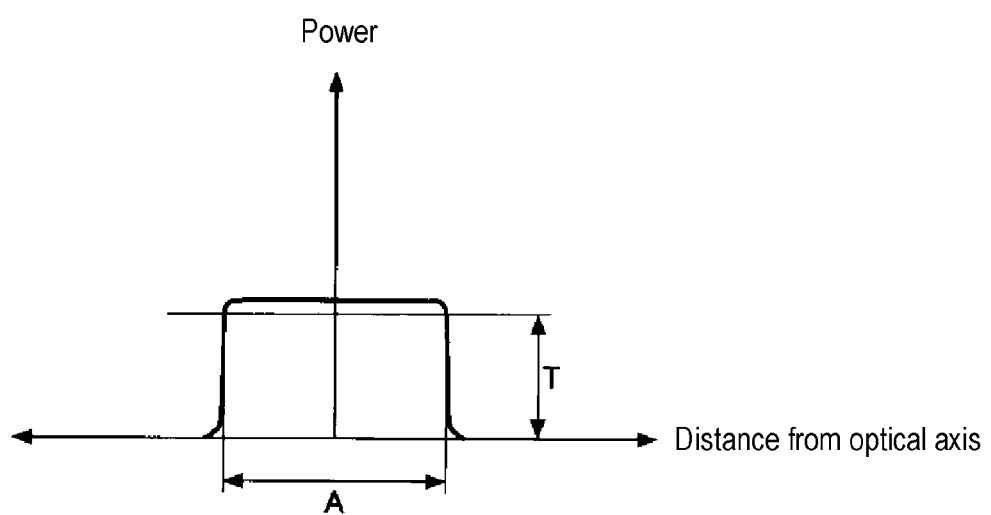

FIGS. 3A and 3B are views showing the power distribution of the laser beam LB. FIG. 3A shows a view showing the Gaussian distribution. FIG. 3B is a view showing the top hat distribution.

The Gaussian distribution is a distribution in which the power (unit: W) decreases as a distance from an optical axis of the laser beam LB increases and in which the power is hardly changed in the circumferential direction of the optical axis. The top hat distribution is a uniform distribution in which the power is hardly changed both in the direction orthogonal to the optical axis and in the circumferential direction of the optical axis.

As is apparent from FIGS. 3A and 3B, in the case of the Gaussian distribution, a range A in which the power is equal to or higher than a threshold T is narrower than that in the case of the top hat distribution. Therefore, as will be described later in detail, by changing the power distribution from the top hat distribution to the Gaussian distribution, it is possible to obtain the same effect as reducing the size of an irradiation point P.

The heating unit 70 includes laser fibers 73A, 73B, 73C and 73D. One end of each of the laser fibers 73A, 73B, 73C and 73D is optically connected to the respective homogenizers 72A, 72B, 72C and 72D. For example, the laser fibers 73A to 73D are bundled in a single fiber cable 74 and extend into the gap space 13 through the through-hole 16.

The heating unit 70 includes laser irradiation heads 75A, 75B, 75C and 75D optically connected to the other ends of the laser fibers 73A, 73B, 73C and 73D, respectively. The heating unit 70 further includes a fixing member 79 that fixes the laser irradiation heads 75A to 75D below the hot plate 60 so as to be separated from the hot plate 60. The laser irradiation heads 75A to 75D irradiate a lower surface 60b of the hot plate 60. The hot plate 60 has four regions R1, R2, R3 and R4 (see FIG. 4) partitioned from the center to the outer peripheral edge. The laser irradiation heads 75A to 75D irradiate the regions R1 to R4, respectively. The heating unit 70 includes temperature sensors 76A, 76B, 76C and 76D that measure temperatures of the regions R1, R2, R3 and R4, respectively. The temperature sensors 76A to 76D are fixed to the fixing member 79. The temperature sensors 76A to 76D are, for example, infrared (IR) temperature sensors. The temperature sensors 76A to 76D are connected to a cable 77. The cable 77 is connected to the control part 90. Detection signals of the temperature sensors 76A to 76D are individually outputted to the control part 90.

The laser beam LB can apply a larger amount of heating energy to the hot plate 60 than a halogen lamp beam, an LED beam and a heating fluid (for example, hot water or high-temperature gas), and can rapidly heat the hot plate 60 to a high temperature. The substrate 2 can be rapidly heated to a high temperature through an upper surface 60a of the hot plate 60, which makes it possible to shorten a drying time of the drying liquid L3 supplied to the upper surface 2a. Furthermore, the laser beam LB can locally heat the hot plate 60 as compared with the halogen lamp beam, the LED beam, the heating fluid or the like. For example, a wavelength of the laser beam LB is an infrared wavelength (for example, 800 nm to 1,200 nm).

The substrate elevating member 50 includes a guide portion 52 extending along an inner surface of the through-hole 16, a horizontal portion 51 provided at an upper end of the guide portion 52, and three pins 53 protruding upward from the horizontal portion 51. The pins 53 can pass through pin holes 62 (see FIG. 4) formed in the hot plate 60 and can make contact with the lower surface 2b of the substrate 2. The substrate elevating member 50 is moved in the vertical direction by a substrate elevating mechanism (not shown) controlled by the control part 90. When the substrate 2 is loaded into the substrate processing apparatus 1 and the substrate 2 is unloaded from the substrate processing apparatus 1, the substrate 2 is placed on the tips of the pins 53 penetrating the hot plate 60 through the pin holes 62 and is moved up and down.

Figure 4:
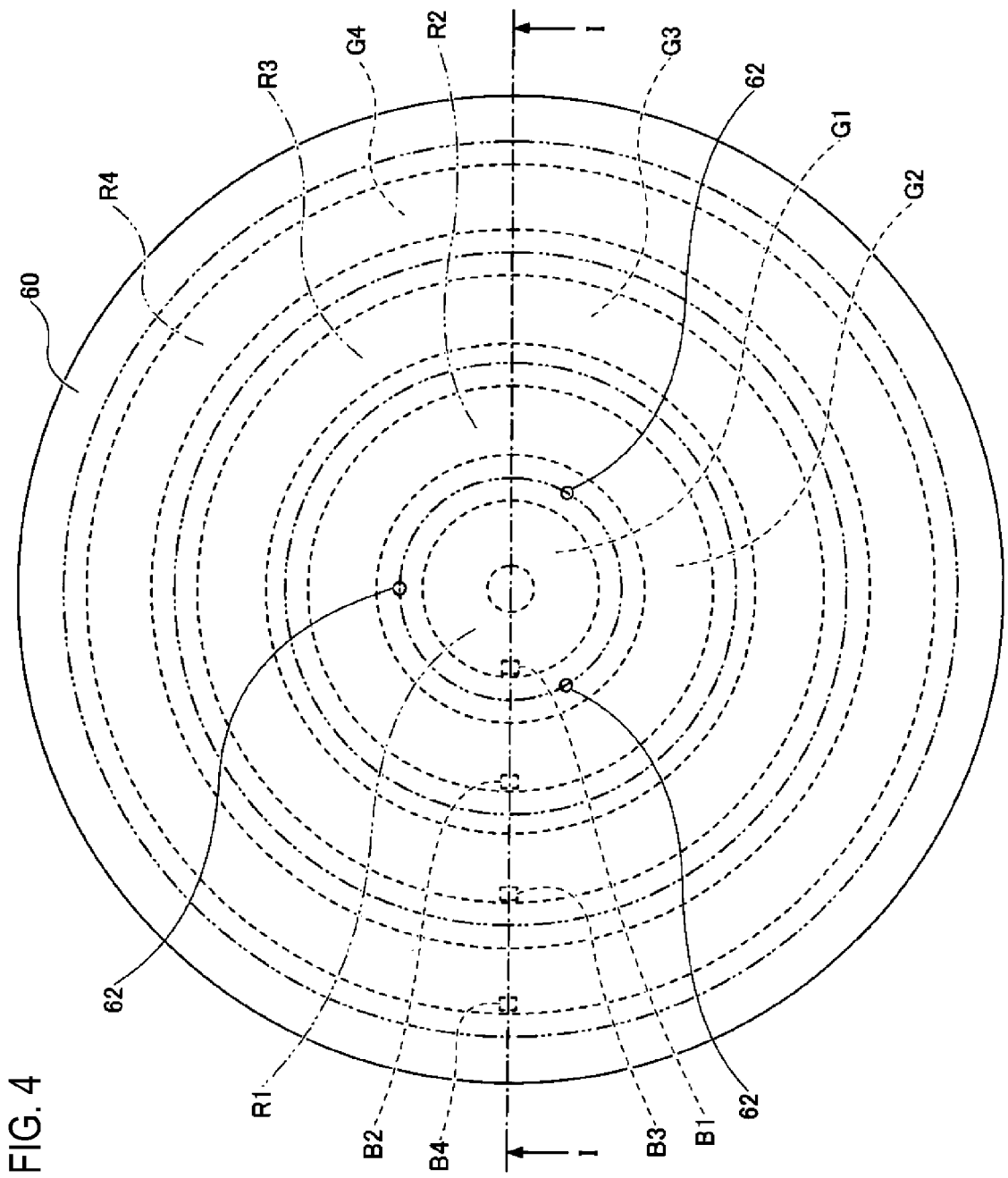
FIG. 4 is a plan view showing a hot plate in the first embodiment.
Figure 5:
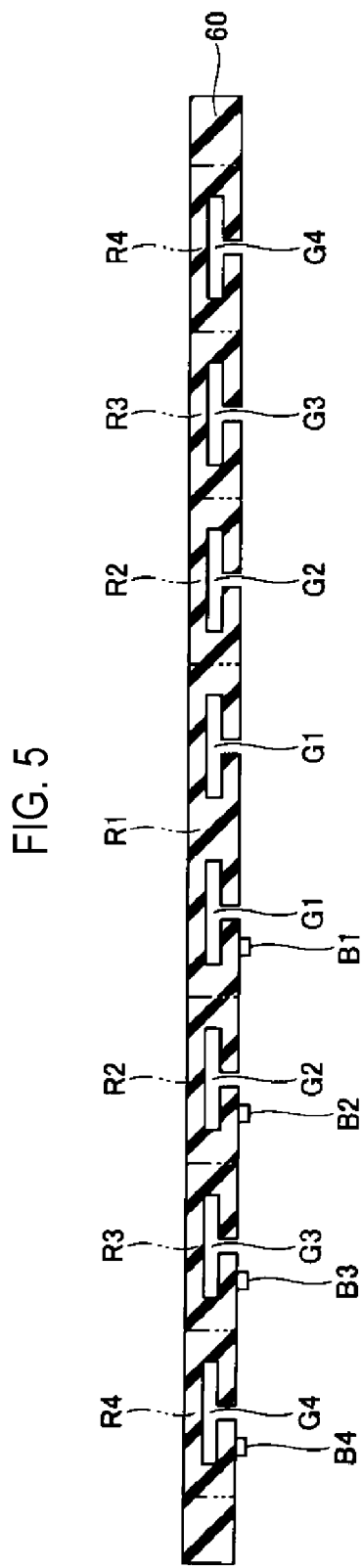
FIG. 5 is a sectional view showing the hot plate in the first embodiment.
Figure 6:
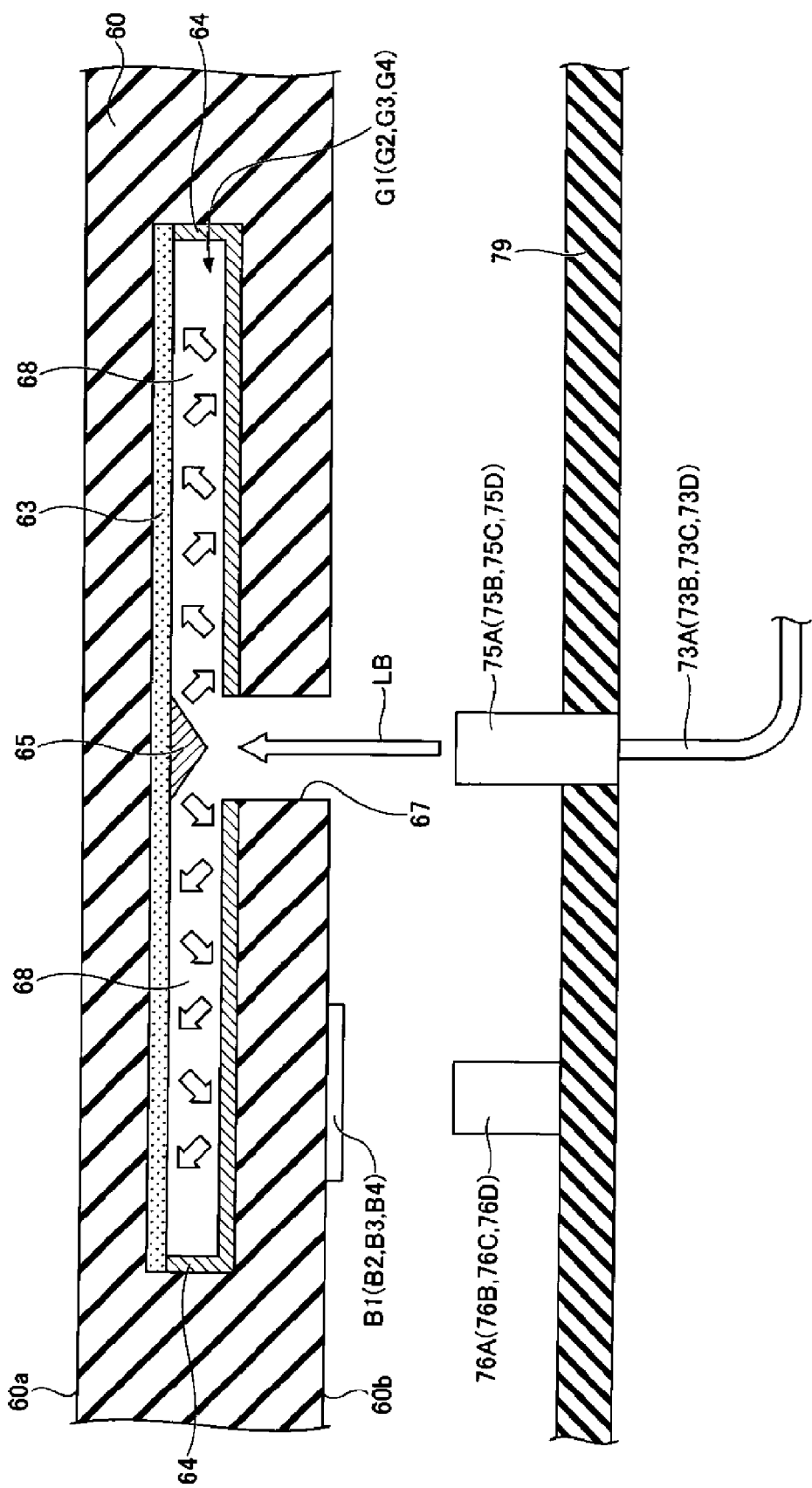
FIG. 6 is a sectional view showing a groove formed in the hot plate in the first embodiment and the periphery of the groove.

FIG. 4 is a plan view showing the hot plate 60 in the first embodiment. FIG. 5 is a sectional view showing the hot plate 60 in the first embodiment. FIG. 5 corresponds to a sectional view taken along line I-I in FIG. 4. FIG. 6 is a sectional view showing grooves formed in the hot plate 60 in the first embodiment and its periphery.

As shown in FIGS. 4 and 5, the hot plate 60 has the four regions R1, R2, R3 and R4 which are partitioned from the center to the outer periphery in a concentric relationship with the substrate 2. That is, in a plan view, the region R1 having a circular shape is provided at the center, the region R2 having an annular shape is provided outside the region R1, the region R3 having an annular shape is provided outside the region R2, and the region R4 having an annular shape is provided outside the region R3. In the example shown in FIGS. 4 and 5, the radius of the region R1 is equal to the radial size of each of the regions R2 to R4, but may be different from the radial size of each of the regions R2 to R4. In the lower surface 60b of the hot plate 60, a groove portion G1 in the region R1, a groove portion G2 in the region R2, a groove portion G3 in the region R3, and a groove portion G4 in the region R4 are formed in a concentric relationship with each other. Furthermore, the lower surface 60b of the hot plate 60 is provided with a black body B1 in the region R1, a black body B2 in the region R2, a black body B3 in the region R3, and a black body B4 in the region R4. Temperatures of the black bodies B1 to B4 correspond to the temperatures of the regions R1 to R4 of the hot plate 60, respectively. The temperatures of the black bodies B1 to B4 are measured by the respective temperature sensors 76A to 76D. That is, the temperature sensors 76A to 76D can measure the temperatures of the regions R1 to R4, respectively. The black bodies B1 to B4 include, for example, black substances such as graphite or the like and are examples of temperature measurement objects. As the material of the hot plate 60, for example, ceramic such as aluminum nitride (AlN) or silicon nitride (SiN) is used.

As shown in FIG. 6, the groove portion G1 has a vertical groove 67 extending upward from the lower surface 60 b and a horizontal groove 68 extending in the horizontal direction from an upper end of the vertical groove 67. Both the vertical groove 67 and the horizontal groove 68 are formed in an annular shape in a plan view. A laser beam absorber 63 is provided on an upper surface (ceiling portion) of the horizontal groove 68. The laser beam absorber 63 includes, for example, a substance such as graphite or the like that can easily absorbs the laser beam LB. A laser beam reflector 65 that reflects the laser beam LB irradiated through the vertical groove 67 toward the horizontal groove 68 is provided above the vertical groove 67. A laser beam reflector 64 is provided on a lower surface and an end surface of the horizontal groove 68. The laser beam reflectors 64 and 65 include, for example, a material such as silver (Ag) or gold (Au) that can easily reflect the laser beam LB. Mirrors may be used as the laser beam reflectors 64 and 65. The vertical groove 67 is an example of a first groove, and the horizontal groove 68 is an example of a second groove.

The laser irradiation head 75A is disposed below the vertical groove 67 of the groove portion G1. The laser beam LB irradiated from the laser irradiation head 75A passes through the vertical groove 67 and is irradiated onto the laser beam reflector 65. The laser beam LB irradiated onto the laser beam reflector 65 is reflected by the laser beam reflector 65. The laser beam LB is reflected by the laser beam reflector 64 in the horizontal groove 68. The laser beam LB is reflected by the laser beam reflector 64 toward the laser beam absorber 63. The laser beam LB irradiated onto the laser beam absorber 63 is absorbed by the laser beam absorber 63. When the laser beam absorber 63 absorbs the laser beam LB, the temperature of the laser beam absorber 63 rises and the temperature around the laser beam absorber 63 also rises. The laser beam LB that is not absorbed by the laser beam absorber 63 is reflected again by the laser beam reflector 64 toward the laser beam absorber 63. Thus, the energy of the laser beam LB irradiated to the groove portion G1 from the laser irradiation head 75A is converted into heat in the groove portion G1, whereby the temperature of the region R1 rises. Since the hot plate 60 rotates, the circular region R1 can be heated by the laser beam LB irradiated from the laser irradiation head 75A. Furthermore, the temperature of the black body B1 is changed according to the temperature of the region RE The temperature of the black body B1 is detected by the temperature sensor 76A.

Similarly, the laser irradiation head 75B is disposed below the vertical groove 67 of the groove portion G2. The laser beam LB irradiated from the laser irradiation head 75B passes through the vertical groove 67 and is irradiated onto the laser beam reflector 65. The energy of the laser beam LB irradiated to the groove portion G2 from the laser irradiation head 75B is converted into heat in the groove portion G2, and the temperature of the region R2 rises. Since the hot plate 60 rotates, the annular region R2 can be heated by the laser beam LB irradiated from the laser irradiation head 75B. Furthermore, the temperature of the black body B2 is changed according to the temperature of the region R2, and the temperature of the black body B2 is detected by the temperature sensor 76B.

Similarly, the laser irradiation head 75C is disposed below the vertical groove 67 of the groove portion G3. The laser beam LB irradiated from the laser irradiation head 75C passes through the vertical groove 67 and is irradiated onto the laser beam reflector 65. The energy of the laser beam LB irradiated to the groove portion G3 from the laser irradiation head 75C is converted into heat in the groove portion G3, and the temperature of the region R3 rises. Since the hot plate 60 rotates, the annular region R3 can be heated by the laser beam LB irradiated from the laser irradiation head 75C. Furthermore, the temperature of the black body B3 is changed according to the temperature of the region R3, and the temperature of the black body B3 is detected by the temperature sensor 76C.

Similarly, the laser irradiation head 75D is disposed below the vertical groove 67 of the groove portion G4. The laser beam LB irradiated from the laser irradiation head 75D passes through the vertical groove 67 and is irradiated onto the laser beam reflector 65. The energy of the laser beam LB irradiated to the groove portion G4 from the laser irradiation head 75D is converted into heat in the groove portion G4, and the temperature of the region R4 rises. Since the hot plate 60 rotates, the annular region R4 can be heated by the laser beam LB irradiated from the laser irradiation head 75D. Furthermore, the temperature of the black body B4 is changed according to the temperature of the region R4, and the temperature of the black body B4 is detected by the temperature sensor 76D.

The control part 90 is configured by, for example, a computer, and includes a CPU (Central Processing Unit) 91 and a storage medium 92 such as a memory or the like. The storage medium 92 stores a program for controlling various processes performed in the substrate processing apparatus 1. The control part 90 controls the operation of the substrate processing apparatus 1 by causing the CPU 91 to execute the program stored in the storage medium 92. The control part 90 further includes an input interface (I/F) 93 and an output interface (I/F) 94. The control part 90 receives an external signal through the input interface 93 and transmits a signal to the outside through the output interface 94.

Such a program may be stored in a non-transitory computer-readable storage medium and may be installed from the non-transitory computer-readable storage medium on the storage medium 92 of the control part 90. Examples of the non-transitory computer-readable storage medium may include a hard disk (HD), a flexible disk (FD), a compact disk (CD), a magneto-optical desk (MO), a memory card and the like. The program may be downloaded from a server via the Internet and may be installed on the storage medium 92 of the control part 90.

Figure 7:
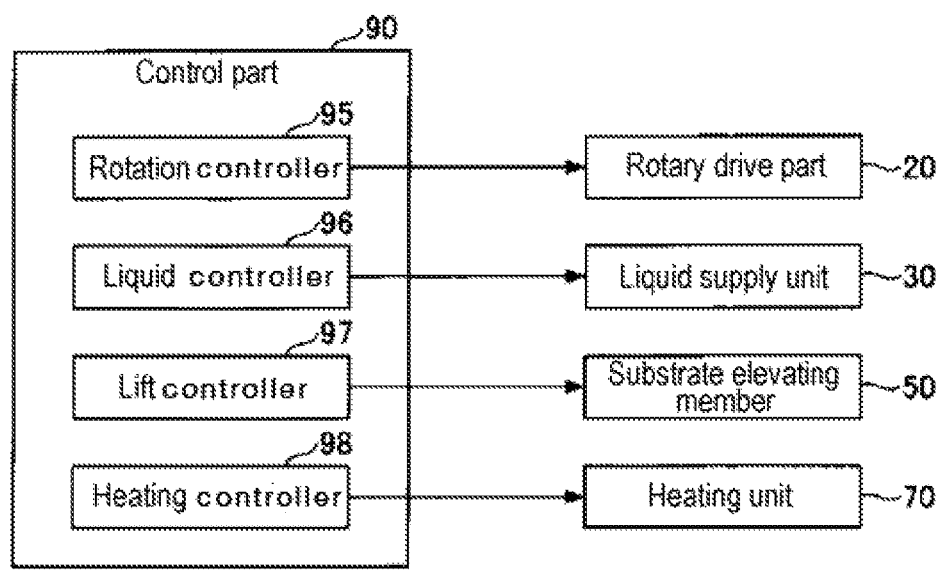
FIG. 7 is a view showing components of a controller in the first embodiment as functional blocks.

FIG. 7 is a view showing components of the control part 90 according to the first embodiment as functional blocks. The respective functional blocks illustrated in FIG. 7 are conceptual and do not necessarily have to be physically configured as illustrated. All or some of the functional blocks may be functionally or physically distributed and integrated in any unit. All or some of respective processing functions performed in the respective functional blocks may be realized by a program executed in the CPU, or may be realized as hardware by wired logic.

The control part 90 includes a rotation controller 95, a liquid controller 96, a lift controller 97, and a heating controller 98. The rotation controller 95 controls the rotary drive part 20. The liquid controller 96 controls the liquid supply unit 30. The lift controller 97 controls the substrate elevating member 50 through a substrate elevating mechanism (not shown). The heating controller 98 controls the heating unit 70. Specific control will be described later.

According to the substrate processing apparatus 1 according to the first embodiment, the hot plate 60 can be heated while rotating the same. Therefore, the heat of the hot plate 60 can be radiated to the substrate 2 with high efficiency during the processing of the rotating substrate 2. In addition, in a case where a resistance heater is built in the rotating hot plate 60, it is necessary to adopt a configuration in consideration of the entanglement associated with the rotation of a wiring connected to the resistance heater. However, in the substrate processing apparatus 1, even if the substrate 2 rotates, the laser irradiation heads 75A to 75D do not rotate. Therefore, the fiber cable 74 and the cable 77 connected to the temperature sensors 76A to 76D can be easily prevented from being entangled.

Furthermore, since the output of the laser beam LB can be changed rapidly, it is possible to quickly heat or cool down the hot plate 60. Moreover, since the diameter of the irradiation spot of the laser beam LB can be easily adjusted by the laser irradiation heads 75A to 75D, it is also possible to perform local heating.

In the present embodiment, the hot plate 60 can be brought close to the substrate 2, the temperature of the hot plate 60 is very close to the temperature of the substrate 2, and the temperatures of the black bodies B1 to B4 are very close to the temperatures of the regions R1 to R4 of the substrate 2, respectively. Accordingly, highly accurate feedback control can be performed based on the temperatures measured by the temperature sensors 76A to 76D. In addition, since the characteristics of the infrared temperature sensor are changed according to the material of the measurement object, it is necessary to adjust the parameters of the infrared temperature sensor each time when the detection object is changed. For example, when detecting the infrared rays emitted from the substrate 2 using the infrared temperature sensor, it is necessary to adjust parameters depending on whether the substrate 2 is a silicon substrate or a sapphire substrate. On the other hand, in the present embodiment, the measurement objects of the temperature sensors 76A to 76D are the black bodies B1 to B4, and the measurement objects remain unchanged even if the material of the substrate 2 is changed. For this reason, it is only necessary to once adjust the parameters to those suitable for the black bodies B1 to B4.

The black bodies B1 to B4 may be provided in an island shape in the respective regions R1 to R4, or may be provided in an annular shape just like the groove portions G1 to G4.

In the present embodiment, the holding of the substrate 2 by the substrate holding part 10 is performed by a mechanical chuck using the guide portion 12. Alternatively, the substrate 2 may be held by a vacuum chuck.

Figure 8:
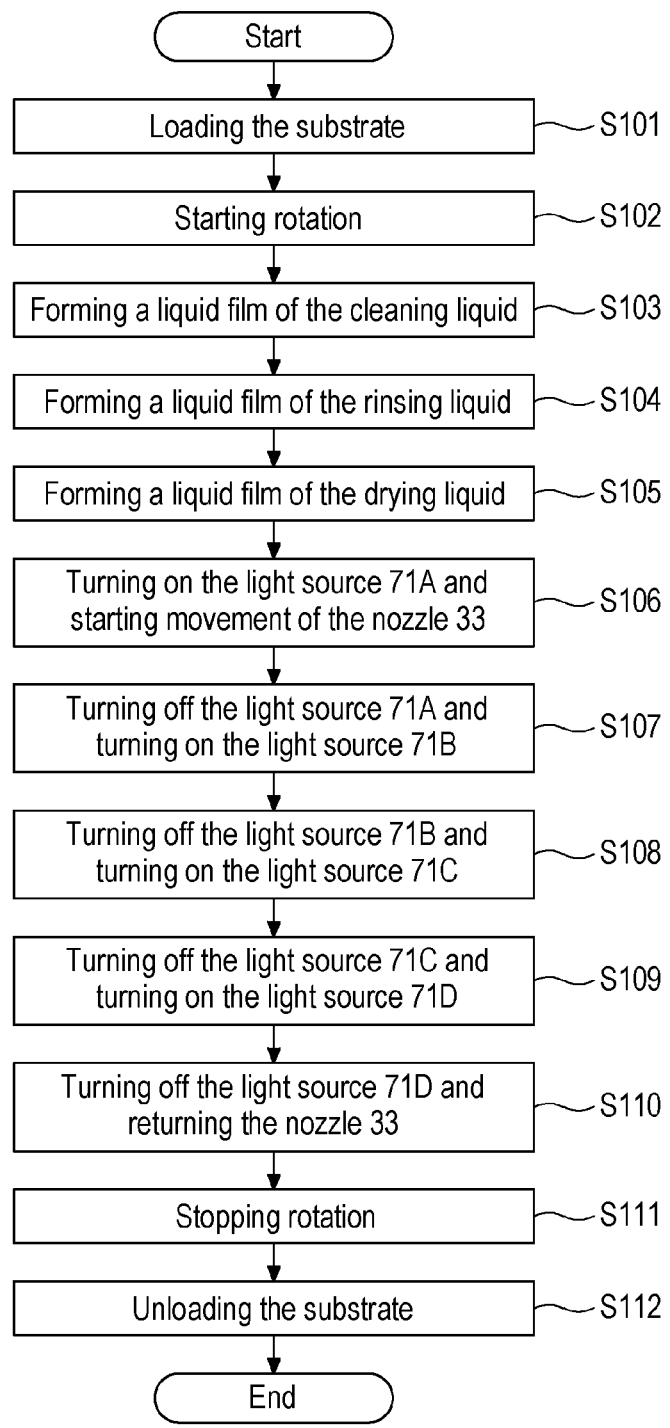
FIG. 8 is a flowchart showing a substrate processing method using the substrate processing apparatus according to the first embodiment.
Figure 9C:
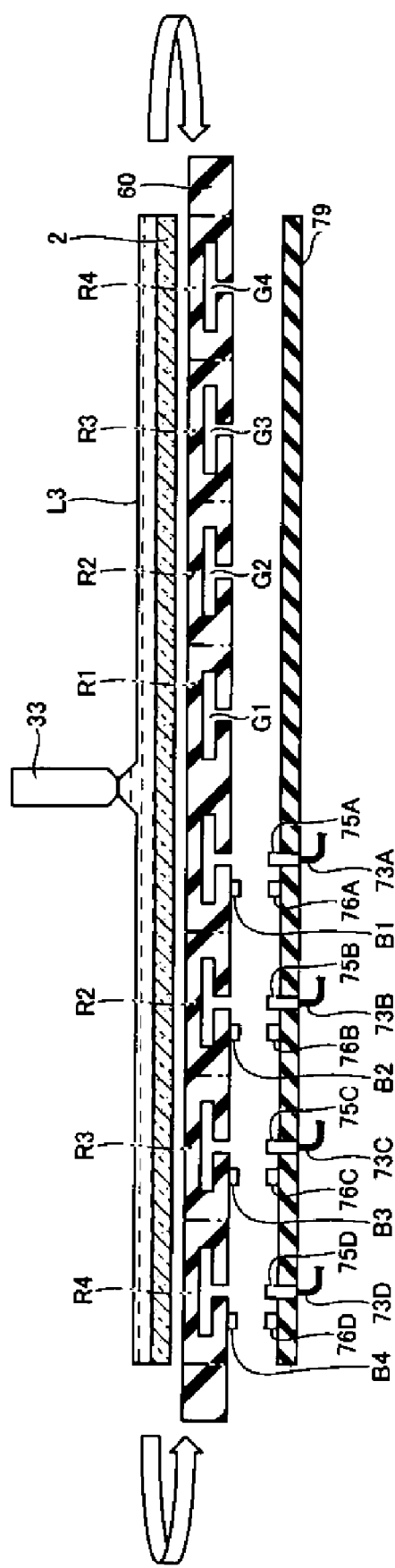
Figure 11C:
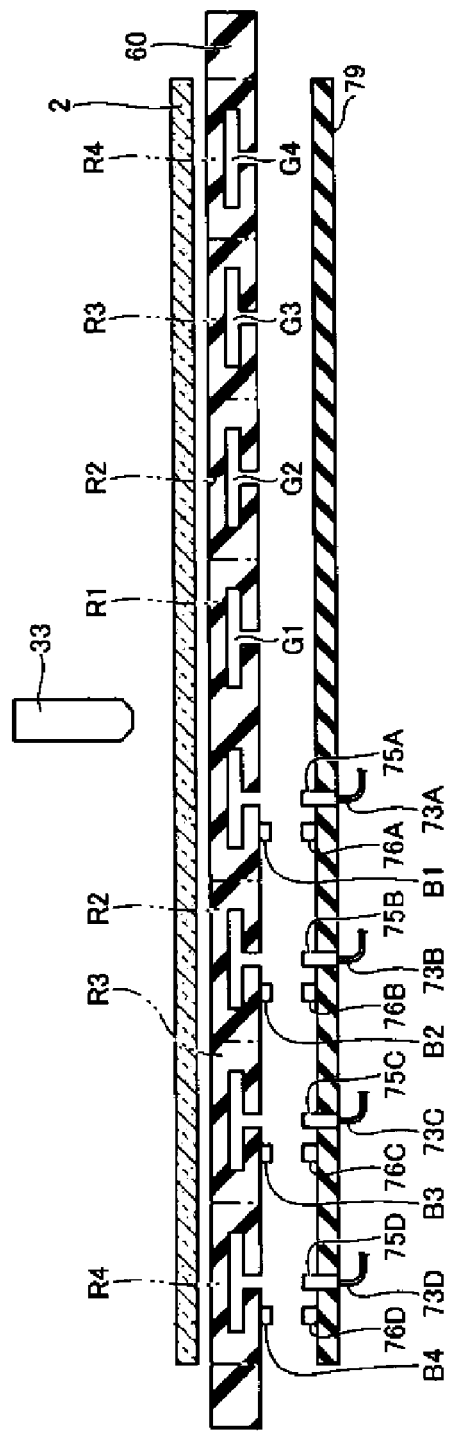

Next, a substrate processing method using the substrate processing apparatus 1 will be described. FIG. 8 is a flowchart showing the substrate processing method using the substrate processing apparatus 1. FIGS. 9A to 11C are views showing changes in the state of the substrate processing apparatus 1. FIG. 9A is a view showing a state when a liquid film of the cleaning liquid is formed. FIG. 9B is a view illustrating a state when a liquid film of the rinsing liquid is formed. FIG. 9C is a view showing a state when a liquid film of the drying liquid is formed. FIG. 10A is a view showing a state during the processing of the region R1. FIG. 10B is a view showing a state during the processing of the region R2. FIG. 10C is a view showing a state during the processing of the region R3. FIG. 11A is a view showing a state during the processing of the region R4. FIG. 11B is a view showing a state after the processing of the region R4. FIG. 11C is a view showing a state when the rotation of the substrate 2 is stopped.

The substrate processing method includes a step of loading an unprocessed substrate 2 into the substrate processing apparatus 1 (step S101), a step of starting the rotation of the hot plate 60 and the substrate 2 (step S102), and a step of forming a liquid film of a cleaning liquid by discharging the cleaning liquid (step S103). The substrate processing method further includes a step of forming a liquid film of a rinsing liquid (step S104), a step of forming a liquid film of a drying liquid (step S105), and a step of turning on the light source 71A and starting movement of the drying liquid discharge nozzle 33 (step S106). The substrate processing method further includes a step of turning off the light source 71A and turning on the light source 71B (step S107), a step of turning off the light source 71B and turning on the light source 71C (step S108), and a step of turning off the light source 71C and turning on the light source 71D (step S109). The substrate processing method further includes a step of turning off the light source 71D and returning the drying liquid discharge nozzle 33 to an original position (step S110), a step of stopping the rotation of the hot plate 60 and the substrate 2 (step S111), and a step of unloading a processed substrate 2 from the substrate processing apparatus 1 (step S112).

In the substrate processing method, first, in step S101, the unprocessed substrate 2 is loaded into the substrate processing apparatus 1. The substrate holding part 10 of the substrate processing apparatus 1 holds the substrate 2 loaded thereinto by a transfer device (not shown). The substrate holding part 10 holds the substrate 2 horizontally so that the uneven pattern formed on the substrate 2 faces upward. At this time, the lift controller 97 controls the substrate elevating member 50 through the substrate elevating mechanism. That is, the substrate elevating member 50 is raised so that the tips of the three pins 53 are positioned above the hot plate 60 to mount the substrate 2 thereon. When the substrate 2 is mounted on the tips of the pins 53, the substrate elevating member 50 is lowered and held by the guide portion 12 of the substrate holding part 10. Then, the substrate elevating member 50 is lowered until the tips of the pins 53 are positioned below the hot plate 60.

Thereafter, in step S102, the rotation controller 95 controls the rotary drive part 20 to start the rotation of the substrate holding part 10. As the substrate holding part 10 rotates, the hot plate 60 and the substrate 2 begin to rotate. The rotation speed of the substrate 2 is, for example, 200 rpm to 1,000 rpm.

Subsequently, in step S103, the liquid controller 96 controls the liquid supply unit 30, so as to supply the cleaning liquid L1 from above to the substrate 2 held by the substrate holding part 10 as shown in FIG. 9A, thereby forming a liquid film of the cleaning liquid L1 that covers the upper surface 2a of the substrate 2. In step S103, the cleaning liquid discharge nozzle 31 is disposed directly above the central portion of the substrate 2. The cleaning liquid discharge nozzle 31 supplies the cleaning liquid L1 from above to the central portion of the substrate 2 rotating together with the substrate holding part 10. The supplied cleaning liquid L1 soaks and spreads over the entire upper surface 2a of the substrate 2 by virtue of a centrifugal force, thereby forming the liquid film.

Subsequently, in step S104, the liquid controller 96 controls the liquid supply unit 30 so as to replace the previously formed liquid film of the cleaning liquid L1 with a liquid film of the rinsing liquid L2 as shown in FIG. 9B. In step S104, instead of the cleaning liquid discharge nozzle 31, the rinsing liquid discharge nozzle 32 is disposed directly above the central portion of the substrate 2. The discharge of the cleaning liquid L1 from the cleaning liquid discharge nozzle 31 is stopped, and the discharge of the rinsing liquid L2 from the rinsing liquid discharge nozzle 32 is started. The rinsing liquid L2 is supplied to the central portion of the substrate 2 rotating together with the substrate holding part 10. The rinsing liquid L2 soaks and spreads over the entire upper surface 2a of the substrate 2 under a centrifugal force, thereby forming a liquid film. As a result, the cleaning liquid L1 remaining on the upper surface 2a is replaced with the rinsing liquid L2.

Thereafter, in step S105, the liquid controller 96 controls the liquid supply unit 30 so as to replace the previously formed liquid film of the rinsing liquid L2 with a liquid film of the drying liquid L3 as shown in FIG. 9C. In step S105, instead of the rinsing liquid discharge nozzle 32, the drying liquid discharge nozzle 33 is disposed directly above the central portion of the substrate 2. The discharge of the rinsing liquid L2 from the rinsing liquid discharge nozzle 32 is stopped, and the discharge of the drying liquid L3 from the drying liquid discharge nozzle 33 is started. The drying liquid L3 is supplied to the central portion of the substrate 2 rotating together with the substrate holding part 10. The drying liquid L3 soaks and spreads over the entire upper surface 2a of the substrate 2 under a centrifugal force to form a liquid film. Thus, the rinsing liquid L2 remaining on the upper surface 2a is replaced with the drying liquid L3.

Subsequently, in step S106, the heating controller 98 controls the heating unit 70 to turn on the light source 71A and start the movement of the drying liquid discharge nozzle 33 as shown in FIG. 10A. The drying liquid discharge nozzle 33 is moved outward from the rotation center of the substrate 2 by the liquid discharge nozzle moving mechanism 45 (see FIG. 2). By turning on the light source 71A, the laser beam LB is irradiated from the laser irradiation head 75A toward the groove portion G1. Upon irradiating the laser beam LB, the laser beam absorber 63 in the groove portion G1 absorbs the laser beam LB, and the temperature of the laser beam absorber 63 rises, whereby a heated region 69A is formed around the groove portion G1. Since the hot plate 60 is rotating, the region R1 is heated circularly. As the drying liquid discharge nozzle 33 moves, the liquid film on the upper surface 2a of the substrate 2 becomes gradually thinner on the side of the rotation center of the drying liquid discharge nozzle 33. At this time, since the region R1 remains heated, the liquid film evaporates rapidly on the center side of the drying liquid discharge nozzle 33. Therefore, the upper surface 2a can be dried in the region R1 without generating spots. The light source 71A outputs the laser beam LB while the drying liquid discharge nozzle 33 is located above the region RE The output is preferably increased as the drying liquid discharge nozzle 33 is moved away from the center. This is because the circumferential movement speed increases, and the temperature tends to decrease as the distance from the rotation center increases.

Thereafter, when the drying liquid discharge nozzle 33 moves from the region R1 to the region R2, in step S107, the heating controller 98 controls the heating unit 70 so as to turn off the light source 71A and turn on the light source 71B. As shown in FIG. 10B, by turning off the light source 71A and turning on the light source 71B, the laser beam LB is irradiated from the laser irradiation head 75B toward the groove portion G2. Upon irradiating the laser beam LB, the laser beam absorber 63 in the groove portion G2 absorbs the laser beam LB, and the temperature of the laser beam absorber 63 rises, whereby a heated region 69B is formed around the groove portion G2. Since the hot plate 60 is rotating, the region R2 is heated in an annular shape. As the drying liquid discharge nozzle 33 moves, the liquid film on the upper surface 2a of the substrate 2 becomes gradually thinner on the side of the rotation center of the drying liquid discharge nozzle 33. At this time, since the region R2 remains heated, the liquid film quickly evaporates on the center side of the drying liquid discharge nozzle 33. Therefore, the upper surface 2a can be dried in the region R2 without generating spots. The light source 71B outputs the laser beam LB while the drying liquid discharge nozzle 33 is located above the region R2. The output is preferably increased as the drying liquid discharge nozzle 33 is moved away from the rotation center.

Thereafter, when the drying liquid discharge nozzle 33 moves from the region R2 to the region R3, in step S108, the heating controller 98 controls the heating unit 70 to turn off the light source 71B and turn on the light source 71C. As shown in FIG. 10C, by turning off the light source 71B and turning on the light source 71C, the laser beam LB is irradiated from the laser irradiation head 75C toward the groove portion G3. Upon irradiating the laser beam LB, the laser beam absorber 63 in the groove portion G3 absorbs the laser beam LB, and the temperature of the laser beam absorber 63 rises, whereby a heated region 69C is formed around the groove portion G3. Since the hot plate 60 is rotating, the region R3 is heated in an annular shape. As the drying liquid discharge nozzle 33 moves, the liquid film on the upper surface 2a of the substrate 2 becomes gradually thinner on the side of the rotation center of the drying liquid discharge nozzle 33. At this time, since the region R3 remains heated, the liquid film quickly evaporates on the center side of the drying liquid discharge nozzle 33. Therefore, the upper surface 2a can be dried in the region R3 without generating spots. The light source 71C outputs the laser beam LB while the drying liquid discharge nozzle 33 is located above the region R3. The output is preferably increased as the drying liquid discharge nozzle 33 is moved away from the rotation center.

Thereafter, when the drying liquid discharge nozzle 33 moves from the region R3 to the region R4, in step S109, the heating controller 98 controls the heating unit 70 to turn off the light source 71C and turn on the light source 71D. As shown in FIG. 11A, by turning off the light source 71C and turning on the light source 71D, the laser beam LB is irradiated from the laser irradiation head 75D toward the groove portion G4. Upon irradiating the laser beam LB, the laser beam absorber 63 in the groove portion G4 absorbs the laser beam LB, and the temperature of the laser beam absorber 63 rises, whereby a heated region 69D is formed around the groove portion G4. Since the hot plate 60 is rotating, the region R4 is heated in an annular shape. As the drying liquid discharge nozzle 33 moves, the liquid film on the upper surface 2a of the substrate 2 becomes gradually thinner on the side of the rotation center of the drying liquid discharge nozzle 33. At this time, since the region R4 remains heated, the liquid film quickly evaporates on the center side of the drying liquid discharge nozzle 33. Therefore, the upper surface 2a can be dried in the region R4 without generating spots. The light source 71D outputs the laser beam LB while the drying liquid discharge nozzle 33 is located above the region R4. The output is preferably increased as the drying liquid discharge nozzle 33 is moved away from the rotation center.

Thereafter, when the drying liquid discharge nozzle 33 moves to the outer peripheral edge of the region R4, in step S110, the heating controller 98 controls the heating unit 70 to turn off the light source 71D and the drying liquid discharge nozzle 33 is moved to an initial position, i.e., a position above the rotation center of the substrate 2 as shown in FIG. 11B.

Subsequently, in step S111, the rotation controller 95 controls the rotary drive part 20 to stop the rotation of the substrate holding part 10. As shown in FIG. 11C, the rotation of the hot plate 60 and the substrate 2 is stopped as the rotation of the substrate holding part 10 is stopped.

Subsequently, in step S112, the processed substrate 2 is unloaded from the substrate processing apparatus 1. The substrate holding part 10 releases the holding of the substrate 2. The transfer device (not shown) receives the substrate 2 from the substrate holding part 10 and transfers the same out of the substrate processing apparatus 1. At this time, the lift controller 97 controls the substrate elevating member 50 through the substrate lift mechanism. That is, the substrate elevating member 50 is raised so that the substrate 2 is moved upward by the tips of the three pins 53. Thus, the substrate 2 is delivered to the transfer device.

According to the substrate processing method described as above, the upper surface 2a of the substrate 2 can be dried without generating dry spots. Furthermore, since the temperatures of the black bodies B1 to B4 detected by the temperature sensors 76A to 76D reflect the temperatures of the regions R1 to R4 with high accuracy, highly accurate feedback control can be performed when controlling the outputs of the light sources 71A to 71D.

In the first embodiment, each of the groove portions G1 to G4 has the horizontal groove 68 including a first portion extending from the upper end of the vertical groove 67 toward the outer peripheral edge of the substrate 2 and a second portion extending from the upper end of the vertical groove 67 toward the central portion of the substrate 2. In some embodiments, only one of the first portion and the second portion may be provided in each of the groove portions G1 to G4. FIG. 12 is a sectional view showing a modification of the groove portion and its periphery.

In this modification, a vertical groove 67 and a first portion extending from the upper end of the vertical groove 67 toward the outer peripheral edge of the substrate 2 are provided in a groove portion G11. However, a second portion extending from the upper end of the vertical groove 67 toward the central portion of the substrate is not provided in the groove portion G11. A black body B11 is provided below a horizontal groove 68 on the lower surface 60b of the hot plate 60. A temperature sensor 86 for detecting the temperature of the black body B11 is fixed to the fixing member 79 together with a laser irradiation head 85. One end of a laser fiber 83 is optically connected to the laser irradiation head 85, and the other end of the laser fiber 83 is optically connected to a light source via a homogenizer. The groove portion G11 is irradiated with a laser beam LB so that the laser beam LB enters the horizontal groove 68 obliquely upward from the laser irradiation head 85.

The laser beam LB irradiated from the laser irradiation head 85 passes through the vertical groove 67 and is irradiated onto the laser beam absorber 63. The laser beam LB irradiated onto the laser beam absorber 63 is absorbed by the laser beam absorber 63. When the laser beam absorber 63 absorbs the laser beam LB, the temperature of the laser beam absorber 63 rises, and the surrounding temperature also rises. The laser beam LB not absorbed by the laser beam absorber 63 is reflected again by the laser beam reflector 64 toward the laser beam absorber 63. Thus, the energy of the laser beam LB irradiated onto the groove portion G11 from the laser irradiation head 85 is converted into heat in the groove portion G11, and the temperature of the region around the groove portion G11 rises. Furthermore, the temperature of the black body B11 is changed according to the temperature of this region. The temperature of the black body B11 is detected by the temperature sensor 86.

The groove portion G11 of the modification may be used for some of the groove portions G1 to G4 or may be used for all of the groove portions G1 to G4.

The heating of the hot plate 60 is not limited to the time of drying, and the substrate 2 may be heated through the hot plate 60 when the cleaning is performed using the cleaning liquid L1. In this case, it is preferable that the temperature of the hot plate 60 be uniform in both the radial direction and the circumferential direction. This is to improve the uniformity of the characteristics of the semiconductor device formed on the substrate 2. For this reason, it is preferable to control the outputs of the light sources 71A to 71D so that the temperature differences between the regions R1 to R4 are reduced while detecting the temperatures of the regions R1 to R4 with the temperature sensors 76A to 76D. When rinsing is performed with the rinsing liquid L2, it is preferable to stop the irradiation of the laser beam LB and cool down the substrate 2 with the rinsing liquid L2.

Furthermore, the output of the laser beam LB may not be necessarily changed and may be kept constant. When changing the output of the laser beam LB, it is not always necessary to increase the output as the drying liquid discharge nozzle 33 approaches the outer peripheral edge of the substrate 2, and the output may be appropriately reduced. The method of adjusting the output of the laser beam LB is not particularly limited. For example, the diameter of an irradiation spot may be adjusted, or the duty ratio of pulses may be adjusted.

Second Embodiment

Figure 13:
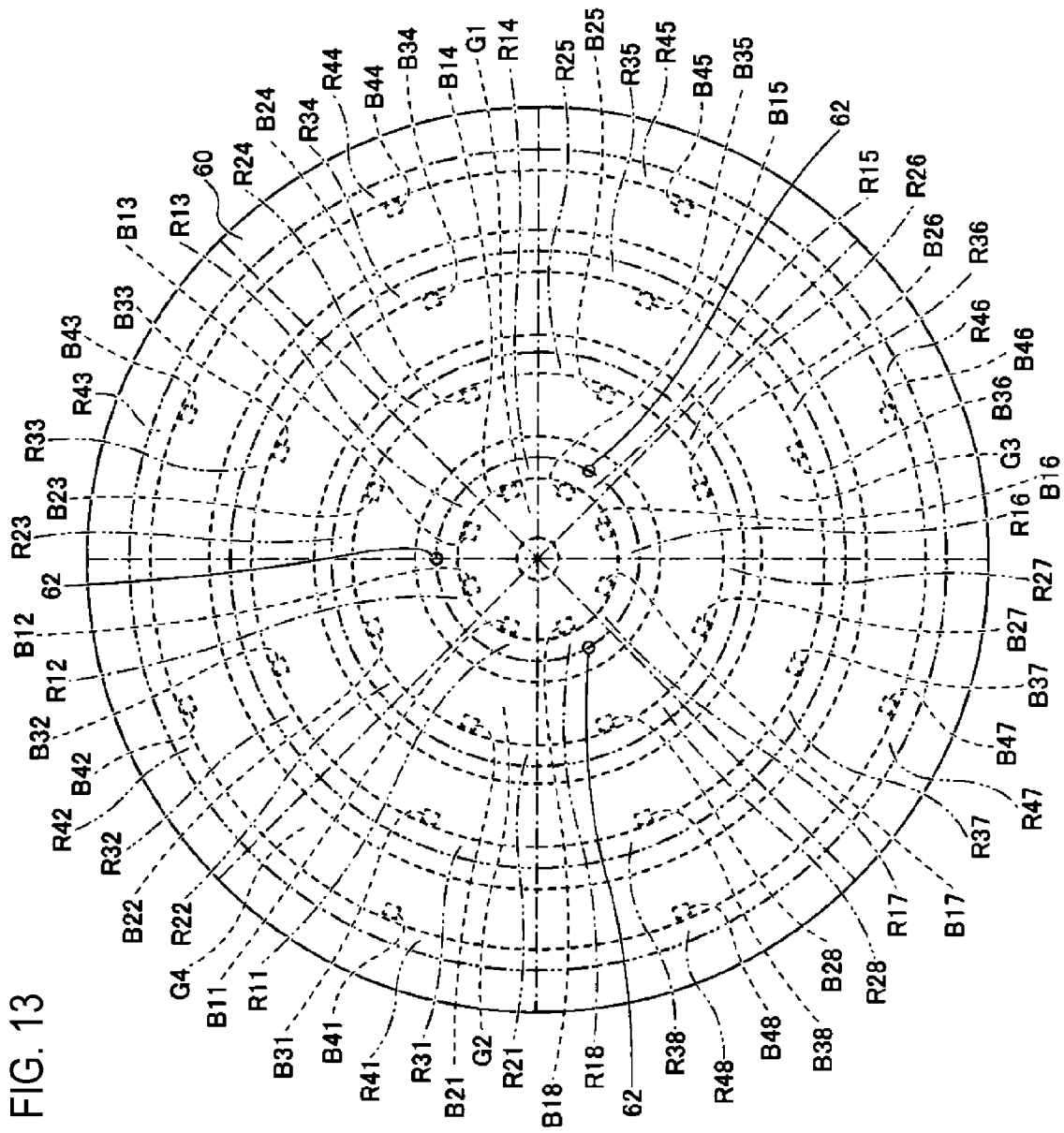
FIG. 13 is a plan view showing a hot plate in a second embodiment.

Next, a second embodiment will be described. In the first embodiment, one temperature sensor is provided in each of the regions R1 to R4. In some embodiments, the regions R1 to R4 may be divided into a plurality of sub-regions in the circumferential direction, and one temperature sensor may be provided for each sub-region. FIG. 13 is a plan view showing a hot plate 60 in the second embodiment.

In the second embodiment, as shown in FIG. 13, a region corresponding to the region R1 in the first embodiment is divided into eight sub-regions R11, R12, R13, R14, R15, R16, R17 and R18 in the circumferential direction. The sub-regions R11 to R18 are arranged in the named order along the circumferential direction. The sub-region R11 and the sub-region R18 are adjacent to each other. In the sub-regions R11, R12, R13, R14, R15, R16, R17 and R18, black bodies B11, B12, B13, B14, B15, B16, B17 and B18 are provided on the lower surface 60b so as to overlap with the groove portion G1 in a plan view just like the black body B1.

A region corresponding to the region R2 is divided into eight sub-regions R21, R22, R23, R24, R25, R26, R27 and R28 in the circumferential direction. The sub-regions R21 to R28 are arranged in the named order along the circumferential direction. The sub-region R21 and the sub-region R28 are adjacent to each other. In the sub-regions R21, R22, R23, R24, R25, R26, R27 and R28, black bodies B21, B22, B23, B24, B25, B26, B27 and B28 are provided on the lower surface 60b so as to overlap with the groove portion G2 in a plan view just like the black body B2.

A region corresponding to the region R3 is divided into eight sub-regions R31, R32, R33, R34, R35, R36, R37 and R38 in the circumferential direction. The sub-regions R31 to R38 are arranged in the named order along the circumferential direction. The sub-region R31 and the sub-region R38 are adjacent to each other. In the sub-regions R31, R32, R33, R34, R35, R36, R37 and R38, black bodies B31, B32, B33, B34, B35, B36, B37 and B38 are provided on the lower surface 60b so as to overlap with the groove portion G3 in a plan view just like the black body B3.

A region corresponding to the region R4 is divided into eight sub-regions R41, R42, R43, R44, R45, R46, R47 and R48 in the circumferential direction. The sub-regions R41 to R48 are arranged in the named order along the circumferential direction. The sub-region R41 and the sub-region R48 are adjacent to each other. In the sub-regions R41, R42, R43, R44, R45, R46, R47 and R48, black bodies B41, B42, B43, B44, B45, B46, B47 and B48 are provided on the lower surface 60b so as to overlap with the groove portion G4 in a plan view just like the black body B4.

Other configurations are the same as those of the first embodiment.

In the second embodiment having such a configuration, the temperature of the hot plate 60 can be measured at eight locations in the circumferential direction. Therefore, by obtaining the temperature distribution in the circumferential direction and controlling the outputs of the light sources 71A to 71D based on the temperature distribution, it is possible to improve the in-plane temperature uniformity. For example, when there is a sub-region having a low temperature in the circumferential direction, the temperature of the respective sub-region can be brought close to the temperature of other regions by increasing the output of the laser irradiation head when the respective sub-region passes above the laser irradiation head. In particular, when the substrate 2 is heated while performing the cleaning with the cleaning liquid L1, the uniformity of the characteristics of the semiconductor device formed on the substrate 2 can be improved by improving the in-plane temperature uniformity. Furthermore, even when performing the etching of the peripheral edge portion of the substrate 2 which is called bevel etching, residual etching and excessive etching can be suppressed by improving the temperature uniformity in the circumferential direction.

The substrate processing apparatus of the present disclosure may also be used in forming, for example, various films on a substrate. That is, the substrate processing apparatus of the present disclosure may also be used in forming an organic film (such as a resist film or a naphthalene film) or a plating film by spin coating while heating the substrate 2.

Furthermore, the number of the laser irradiation heads provided in the substrate processing apparatus of the present disclosure or the number of the annular grooves provided in the hot plate is not limited to 4, and may be 1, 2 or 3, or 5 or more.

According to the present disclosure in some embodiments, it is possible to heat a substrate while rotating the substrate with a simplified configuration.

While the preferred embodiments have been described in detail above, the present disclosure is not limited to the above-described embodiments. Various modifications and substitutions may be made to the above-described embodiments without departing from the scope described in the claims.

What is claimed is:

1. A substrate processing apparatus, comprising:
   a substrate holding/rotating part configured to hold a substrate on a mounting table and rotate the substrate;
   a laser irradiation head configured to irradiate a laser beam toward a lower surface of the mounting table;
   a controller configured to control at least the rotation of the substrate holding/rotating part and the irradiation of the laser beam;
   a temperature sensor fixed below the mounting table so as to be spaced apart from the mounting table; and
   a temperature measurement object provided on the lower surface of the mounting table, a temperature of the temperature measurement object being detected by the temperature sensor,
   wherein a plurality of groove portions are formed on the lower surface of the mounting table in a concentric relationship with each other, wherein more than one of the laser irradiation head is provided and is fixed below the mounting table so as to be spaced apart from the mounting table, and wherein the laser irradiation heads are arranged to face the plurality of groove portions, respectively,
   the controller controls the laser irradiation head to irradiate the laser beam when the mounting table is rotated by the substrate holding/rotating part, and
   the controller controls an output of the laser beam according to an output of the temperature sensor.

2. The apparatus of claim 1, further comprising:
   a laser beam absorber provided in each of the plurality of groove portions and configured to absorb the laser beam.

3. The apparatus of claim 2, wherein each of the plurality of groove portions includes:
   a first groove extending vertically upward from the lower surface of the mounting table; and
   a second groove extending horizontally from an upper end of the first groove, and
   wherein the laser beam absorber is provided on an upper surface of the second groove, the apparatus further comprising:
   a laser beam reflector provided on a lower surface of the second groove and configured to reflect the laser beam.

4. The apparatus of claim 2, further comprising:
a nozzle configured to supply a processing liquid to an upper surface of the substrate mounted on the mounting table,
wherein when the mounting table is rotated by the substrate holding/rotating part, the controller moves the nozzle outward from a rotation center of the substrate and causes one of the plurality of laser irradiation heads, which is radially located below a region to which the processing liquid is supplied, to irradiate the laser beam.

5. The apparatus of claim 1, further comprising:
a nozzle configured to supply a processing liquid to an upper surface of the substrate mounted on the mounting table,
wherein when the mounting table is rotated by the substrate holding/rotating part, the controller moves the nozzle outward from a rotation center of the substrate and causes one of the plurality of laser irradiation heads, which is radially located below a region to which the processing liquid is supplied, to irradiate the laser beam.

6. The apparatus of claim 5, wherein the controller increases the output of the laser beam as the nozzle is moved away from the rotation center of the substrate.

7. The apparatus of claim 1, wherein each of the plurality of groove portions includes:
a first groove extending vertically upward from the lower surface of the mounting table; and
a second groove extending horizontally from an upper end of the first groove, and
wherein the laser beam absorber is provided on an upper surface of the second groove,
the apparatus further comprising:
a laser beam reflector provided on a lower surface of the second groove and configured to reflect the laser beam.

8. A method of processing a substrate, comprising:
holding the substrate on a mounting table and rotating the substrate; and
heating the substrate through the mounting table by, when the mounting table is rotated, irradiating a laser beam toward a lower surface of the mounting table from a laser irradiation head fixed below the mounting table so as to be spaced apart from the mounting table,
wherein a plurality of groove portions is formed on the lower surface of the mounting table in a concentric relationship with each other, and
the laser beam is irradiated into the plurality of groove portions from more than one of the laser irradiation head arranged to respectively face the plurality of groove portions.

9. The method of claim 8, further comprising:
supplying a processing liquid from a nozzle to an upper surface of the substrate mounted on the mounting table; and
when the mounting table is rotated, moving the nozzle outward from a rotation center of the substrate and causing one of the laser irradiation heads, which is radially located below a region to which the processing liquid is supplied, to irradiate the laser beam.

* * * * *